United States Patent
Ostermayr et al.

(10) Patent No.: US 12,347,796 B2
(45) Date of Patent: Jul. 1, 2025

(54) SEMICONDUCTOR DIES AND DEVICES WITH A COIL FOR INDUCTIVE COUPLING

(71) Applicant: Intel Corporation, Santa Clara, CA (US)

(72) Inventors: Martin Ostermayr, Woerth (DE); Walther Lutz, Erding (DE); Joachim Assenmacher, Unterhaching (DE); Georg Seidemann, Landshut (DE)

(73) Assignee: Intel corporation, Santa Clara, CA (US)

( * ) Notice: Subject to any disclaimer, the term of this patent is extended or adjusted under 35 U.S.C. 154(b) by 769 days.

(21) Appl. No.: 17/448,734

(22) Filed: Sep. 24, 2021

(65) Prior Publication Data

US 2023/0102133 A1   Mar. 30, 2023

(51) Int. Cl.
 *H01L 23/64* (2006.01)
 *H01L 23/00* (2006.01)

(52) U.S. Cl.
CPC ............ *H01L 23/645* (2013.01); *H01L 24/64* (2013.01); *H01L 2924/19042* (2013.01)

(58) Field of Classification Search
CPC .... H10D 84/40; H10D 88/101; H01L 23/645; H01L 24/64; H01L 2924/19042; H01L 21/76898; H01L 23/481; H01L 23/5286; H01L 23/535; H01L 27/0617; H01L 27/0694; H01L 23/5227
See application file for complete search history.

(56) References Cited

U.S. PATENT DOCUMENTS

| | | | |
|---|---|---|---|
| 2008/0020488 A1* | 1/2008 | Clevenger | H01L 23/481 438/3 |
| 2012/0187530 A1* | 7/2012 | Zhang | H01L 23/645 257/532 |
| 2012/0194148 A1* | 8/2012 | Yiu | H01L 23/645 438/106 |
| 2013/0135074 A1* | 5/2013 | Wi | H01F 27/292 336/200 |
| 2016/0218168 A1* | 7/2016 | Leobandung | H01L 23/5227 |
| 2020/0235061 A1* | 7/2020 | Elsherbini | H01L 23/5385 |
| 2020/0273809 A1* | 8/2020 | Liu | H03B 5/1228 |
| 2021/0098370 A1* | 4/2021 | Naser | H01L 21/76898 |
| 2021/0249360 A1* | 8/2021 | Honda | H01L 23/66 |
| 2021/0296258 A1* | 9/2021 | Chien | H01L 23/552 |
| 2021/0344319 A1* | 11/2021 | Gaynor | H01L 23/66 |
| 2022/0013480 A1* | 1/2022 | Chen | H01L 23/5223 |
| 2022/0320019 A1* | 10/2022 | Chang | H01L 23/145 |
| 2023/0093101 A1* | 3/2023 | Xie | H01L 27/1203 257/690 |

FOREIGN PATENT DOCUMENTS

EP       3671859 A1   12/2018
WO  2016022125 A1    2/2016

* cited by examiner

*Primary Examiner* — S M Sohell Imtiaz
(74) *Attorney, Agent, or Firm* — SPL Patent Attorneys PartG mbB; Yong Beom Hwang

(57) ABSTRACT

A semiconductor die is disclosed, including circuitry comprising a transistor at a frontside of a semiconductor substrate, and a backside inductor at a backside of the semiconductor substrate. The backside inductor is electrically connected to the transistor of the circuitry.

12 Claims, 4 Drawing Sheets

SEMICONDUCTOR DIES AND DEVICES WITH A COIL FOR INDUCTIVE COUPLING

FIELD

Examples relate to semiconductor dies and devices with transistors.

BACKGROUND

Semiconductor devices have numerous applications. Power and signal lines can be coupled to the transistors of semiconductor dies and may form part of a working device. Several challenges can arise when forming power and/or signal connections to the transistors.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
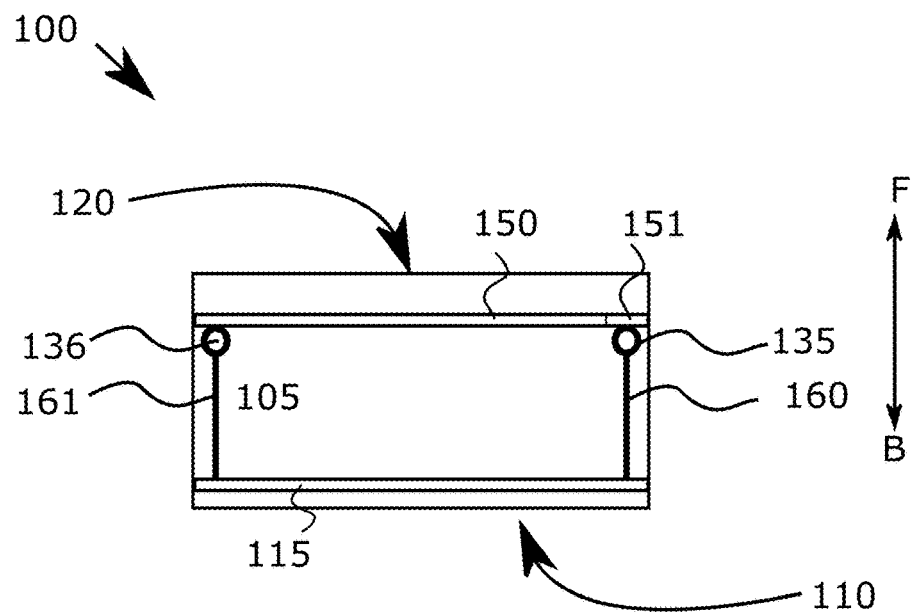
FIG. 1 illustrates a semiconductor die.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Herein, a trailing "(s)" means one or more; for example "transistor(s)" can be one or more transistors.

Herein, a semiconductor substrate can be made of materials including, for example, n-type or p-type materials systems (or a combination of both). The substrate may include, for example, a crystalline substrate formed using a bulk silicon or a silicon-on-insulator (SOI) substructure. In some embodiments, the substrate may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate.

Herein, the transistors may be metal oxide semiconductor field-effect transistors (MOSFETs) and/or FinFETs, e.g. formed using a semiconductor substrate. The is much interest in reducing the size of semiconductor dies/devices, particularly those that utilize FinFETs. The examples herein are however not necessarily limited to semiconductor dies that include FinFETs. A wide variety of other types and configurations such as, for example, planar transistors, non-planar transistors, or a combination of both can be used in combination with the inductor(s) described herein. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. The transistors depicted herein may include additional specific features thereof not depicted or not described for the sake of clarity/brevity, such as device isolation regions, gate contacts, and the like.

Alternatively/additionally, herein, a plurality of transistors may include at least one of a fin field-effect transistor, a nanowire transistor, a ribbon transistor, or a gate all around transistor.

FIG. 1 illustrates a semiconductor die 100. FIG. 1 shows the front F and back directions B, for convenience. The arrow in FIG. 1 showing the front and back directions can be regarded as the z axis of a coordinate space. FIG. 1 shows a cross section in an XZ plane at the top, and a view in the XY plane of a backside inductor 115 (a backside inductor coil). Features described herein with respect to the die of FIG. 1 (or any figure herein) can be combined with features described with respect to other dies herein and vice versa. The die 100 can have a circuit 150 that has one or more transistors 151 (e.g. FinFETs) which may be at a frontside 120 of a semiconductor substrate 105. As seen in FIG. 1, the die 100 includes a backside inductor 115 at a backside 110 of the semiconductor substrate 105. The backside inductor 115 can be arranged for inductive coupling, such as to external fields. The backside inductor can save space, e.g. by reducing the footprint of the die. For example, there can be reduction in wiring at the front end, e.g. by using the backside inductor for electrically coupling to the transistor(s). This can allow for reduction in the area and/or wiring, e.g. at the front end.

The backside inductor 115 can be electrically connected to the transistor(s) 151 of the circuitry 150. The circuitry 150 may not be limited to the frontside, and may include the backside inductor 115. As shown in FIG. 1, the backside inductor 115 is electrically connected to a conductive line 135 at the frontside 120 of a semiconductor substrate, e.g. by a via 160 as shown. There may be more than one conductive line such as second conductive line 136. There may be more than one via such as second via 161 as shown, which may connect to the backside inductor 115. The conductive line(s) 135, 136 can power one or more transistor(s) 151 and/or provide signals to/from the transistor(s). The conductive line can be electrically connected to one or more sources and/or drains at the transistors (e.g. for providing power to the transistors). Alternatively/additionally, the conductive line(s) can be connected electrically to one or more gates of the transistor(s) 151.

Having the electrical connection from the backside inductor to the transistor(s) can provide low capacity coupling. Alternatively/additionally, the backside inductor(s) can be used in combination with other circuitry, providing flexibility of device design.

The backside inductor 115 can include a material which is 90% or more, or even 99% or more, of at least one of aluminum or copper. Alternatively/additionally, the material can include ruthenium and/or tungsten.

It is possible to build fully integrated voltage regulators, for example, using the semiconductor die 100. Integrated voltage regulators are one possibility in which size and space saving can be achieved using the backside inductor as described herein, particularly in combination with the additional optional features described herein.

Figure 2:
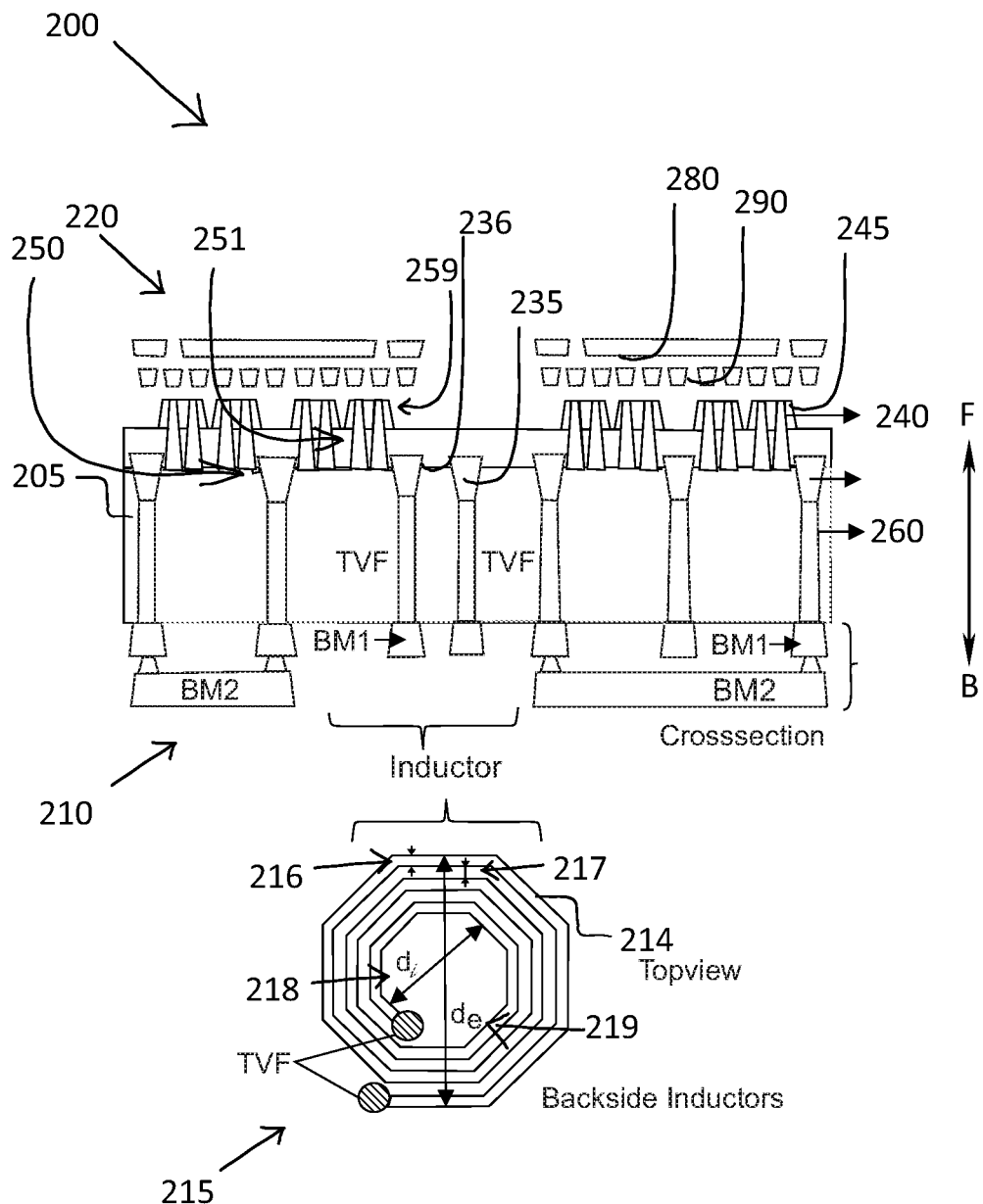
FIG. 2 illustrates a semiconductor die.

FIG. 2 illustrates a semiconductor die 200. Features described herein with respect to the die 200 of FIG. 1 can be combined with other dies described herein and vice versa. FIG. 2 shows the backside 210 and frontside 220 of the die 200. The top of FIG. 2 shows a side cross-section, e.g. in a X-Z plane. At the bottom of FIG. 2 is a view of the one or more inductor(s) 215 which may lie in the XY plane (a plane perpendicular to the Z-direction).

The backside inductor 215 can be electrically connected to one or more transistor(s) 251, e.g. of a circuit 250. The backside inductor 215 can be, as shown in FIG. 2, electrically coupled to one or more conductive lines 235, 236. The conductive lines 235, 236 can be electrically connected to the inductor 235 and/or transistor(s). One or more through vias TVF, 260 may be electrically connected to the inductor and transistors (e.g. connecting the inductor 215 to the conductive line 235). For example, the through via(s) TVF, 260 can electrically connect the inductor 215 to the conductive line(s) 235, 236.

As shown in FIG. 2, the conductive line(s) 235, 236 can be arranged in a region which is between a frontmost part 259 of a gate 245 of the transistor 251 and the semiconductor substrate 205. The conductive line(s) 235, 236 can be is at least partially below a plane at the frontmost side 236 of into the semiconductor substrate 205. The conductive line(s) can be at least partially buried in the semiconductor substrate 205. The conductive line(s) may be arranged vertically between a gate 245 of the transistor and the semiconductor substrate 205 (e.g. between a plane at the gate 245 and the substrate 205).

There can be an oxide thin layer between the conductive line(s) 235, 236 and the semiconductor substrate 205.

The conductive line(s) 235, 236 may run laterally in a trench, which can extend vertically into semiconductor substrate 205. In FIG. 2, the conductive line(s) 235, 236 extend downward (to the back direction) into the semiconductor substrate 205.

The top surface (top being toward the front) of the conductive line(s) 235, 236 may be coplanar with a frontside surface of the semiconductor substrate 205, or may protrude as seen in FIG. 2 from the frontside surface of the semiconductor substrate 110. Optionally, the transistors can have fins such as fin 240 which extend above the frontside surface of the semiconductor substrate 205. The top surface of the conductive line(s) 235, 236 may be below the top of the fins (e.g. below the frontmost side of the fins).

The conductive line(s) 235, 236 may extend to the back side of the semiconductor substrate 205 (e.g. if the semiconductor substrate is thin).

The conductive line(s) 235, 236 can be power supply line(s) and/or be connected to a power supply line. The conductive line(s) 235, 236 can be for powering the transistor(s), for example.

For example, a through substrate via (260 or TVF) may extend from a bottom surface of a conductive line 235, 2236 to the backside of the semiconductor substrate 205. In this case, there may be an electrical connection from the transistor(s) 251 to the inductor 215 by one or more through substrate vias TVFs, 260. The bottom surface of via(s) TVF, 260 may be at a metallization plane of the backside inductor 215.

As shown in FIG. 2, the backside inductor 215 can have one or more turns in an XY plane, e.g. at a plane of backside metallization BM1, BM2. There may additionally be more than one coil in multiple planes to form the inductor. FIG. 2 shows one coil (with 3 turns although more or fewer are possible) with an inner diameter $d_e$ 218 and external diameter $d_e$ 219. The inductance of the coil can be tuned, e.g. to form part of an oscillating circuit with a desired oscillation frequency, and/or to form part of a filter circuit, e.g. for passing and/or blocking frequency ranges. Inner diameter $d_e$ 218 can be from 20 μm up to about 250 μm. the external diameter $d_e$ 219 can be from 50 μm up to about 300 μm.

The backside inductor 215 can be part of an oscillator circuit and/or filter circuit. It is possible to design the pitch and/or distance 217 between the turns, the width/thickness 216 of the trace 214 that form the turns of the coil, the inner diameter 218 and/or the outer diameter 219, for example. These and other parameters such as materials parameters (e.g. substrate materials and/or trace materials) can influence the behavior of circuits (e.g. oscillation and/or filter circuits) formed with the inductor 215. Such parameters can be designed in order to enhance properties of the inductor, such as a resonance and/or inductance.

The backside inductor 215 can include more than one winding such as a plurality of windings each in a respective plane at the backside 210 of the die. Each winding can have one ore more turn. Multiple layers of windings may allow for greater power efficiency and/or tunability of the circuits formed with the inductor 215. FIG. 2 shows multiple backside metallization layers, BM1, BM2, which can each be used to form a respective layer of a winding for the inductor 215, e.g. for forming multiple planes of windings as the inductor. More than one inductor can be formed in the same plane (e.g. at different positions in the XY plane) and/or in different planes (XY planes at different Z). Windings can be linked by vias, for example, such as when a backside inductor 215 has multiple windings in different planes.

A backside inductor 215 can transfer power to the circuitry 250 (e.g. the backside inductor 215 can receive power for the circuitry 250) and/or conductive line 235, 236. Alternatively/additionally, the inductor 215 can transfer a signal to the circuitry 250 (e.g. the backside inductor 215 can receive a signal for the circuitry 250) and/or conductive line 235, 236.

Herein, the inductor(s) may be part of a power delivery network (PDN) which may include a power line(s) such as a buried power rail(s) and/or a power supply line(s). For example, the circuitry and/or conductive line(s) 235, 236 at the frontside 120 can include power lines such as buried power rails and/or power supply lines. The positioning of the conductive lines(s) may allow reduction or elimination of contacts at the front of the die 200.

The backside conductor 215 can also complement other metallizations 280, 290 at the frontside 220 of the die 200 which may be additional metallizations for more power and/or signals. The metallizations 280, 290 are optional. In some cases, it is possible to reduce the footprint of the die 200 by using the backside inductor 215 for coupling signal/power into the die 200 or out of the die 200.

The circuitry 250 and/or buried power rails (and/or the conductive lines 235, 236) may include as a conductive material at least one of copper or aluminum. Tungsten or ruthenium may also be used. High melting point metals such as tungsten or ruthenium may be able to robustly withstand formation conditions of the device which may include high temperature processes such as annealing, bonding, and the like. Alternatively, if process steps are performed at sufficiently low temperatures, e.g. below 450° C., copper and/or aluminum may be used, which have relatively low resistance.

The transistors 251 may be finFETs which have fins 240. Other types of transistors can also be utilized. For example, the transistors 251 may include at least one of a fin field-effect transistor, a nanowire transistor, a ribbon transistor, or a gate all around transistor.

Figure 3:
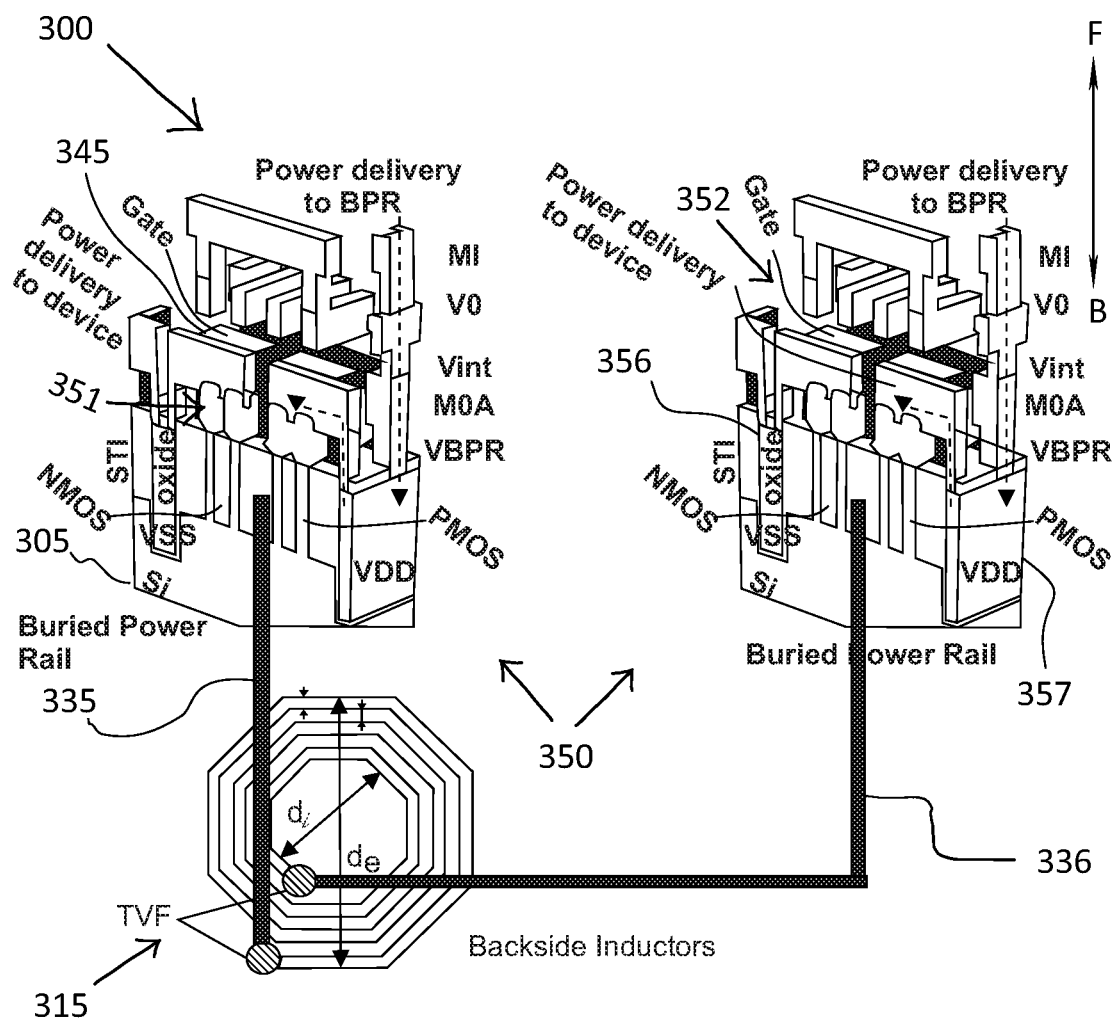
FIG. 3 illustrates a semiconductor die.

FIG. 3 illustrates a semiconductor die. The features described with respect to the die 300 of FIG. 3 can be used in the dies described elsewhere. Similarly, the features described with respect to the dies elsewhere herein can be combined with the die described with respect to FIG. 3.

The die 300 can have a circuit 350 that has one or more transistors 351, 352 (e.g. FinFETs) which may be at a frontside of a semiconductor substrate 305. As seen schematically in FIG. 3, the die 300 includes a backside inductor 315 at a backside of the semiconductor substrate 305.

The backside inductor 315 can be electrically connected to the transistor(s) 351, 352 of the circuitry 350. As shown in FIG. 3, the backside inductor 315 is electrically connected to conductive line(s) 335, 336. One or more vias may connect the backside inductor 315 to the conductive line(s) 335, 336. The conductive line(s) 335, 336 can power one or more transistor(s) 351 and/or provide signals to/from the transistor(s). The conductive line can be electrically connected to one or more sources 356 and/or drains 357 at the transistors 351 (e.g. for providing power to the transistors). Alternatively/additionally, the conductive line(s) 335, 336 can be connected electrically to one or more gates 345 of the transistor(s) 351, 352.

The top surface (or front most surface) of the electrically conductive line(s) 335, 336, shown schematically in FIG. 3, may be contacted by one or more vias, contact structures, and/or one or more transistors. The conductive line(s) 335, 336 may form at least part of a conduction path extending to the back side of the semiconductor substrate 205. The bottom surface of an electrically conductive structure may connect to a conductive line 335, 336. In this way, a connection from front side to back side may be implemented with low effort, since the number of necessary process steps may be kept low. Alternatively, additionally a through substrate via (see also TVF, 260 of FIG. 2) may be connected to the conductive line(s) 335, 336 (e.g. if the semiconductor substrate is thick).

The inductors described herein can be used for filtering and/or smoothing signals (e.g. reducing noise). The inductors can be at positions near or within packages and/or dies, such as is described herein. The inductors described herein may reduce signal losses by voltage drops.

The inductors described herein can be formed at the backside of semiconductor dies, such as by metallization processes. It is possible to contact the backside inductors described herein with circuitry of semiconductor dies, such as by utilizing vias and/or other conductive connections (e.g. vertical connections) from the inductor to the transistor(s). Backside metallizations, adapted to form inductors (e.g. the backside inductors as described herein), can be utilized with many different types of circuits, including filtering and/or oscillating circuits, including circuits that utilize at least one transistor. It may be possible to reduce the footprint of the die and/or device, and possibly reduce the amount of wiring, particularly at the frontend of the die, particularly when using a backside inductor for signal and/or power coupling. The backside inductors describe ed herein may replace at least some frontend circuitry, for example, by having the inductor at the backside to provide the power and/or signal. In one application, for example, the backend inductors described herein can be used with integrated voltage regulators, e.g. for powering transistor(s).

Figure 4A:
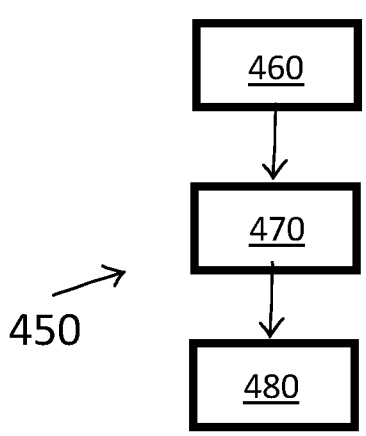
FIG. 4A illustrates a method of operating a semiconductor device.

FIG. 4A shows a method 450 of operation of a semiconductor package or device. A semiconductor package and/or device which includes any of the dies as described herein can be operated by driving 460 current in the inductor at the backside of the semiconductor device. The inductor can be conductively connected to at least one conductive line, such as a plurality of buried power rails. The method can include driving 470 current in the buried power rails for at least one of 480: powering a plurality of transistors, transmitting a signal to the transistors, transforming power for powering the transistors, filtering a signal, providing an oscillating signal, or providing an oscillating power source to the plurality of transistors. The method can also include driving the current in the inductor by inductive coupling from an external device which is inductively coupled to the inductor.

Figure 4B:
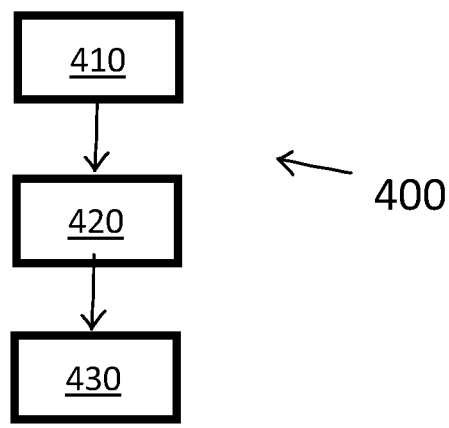
FIG. 4B illustrates a method of forming a semiconductor die.

FIG. 4B illustrates a method of forming a semiconductor die. The method 400 includes forming 410 a transistor at a frontside of a semiconductor substrate, forming 420 circuitry including the transistor, and forming 430 a backside inductor at a backside of the semiconductor substrate. The backside inductor is electrically connected to the transistor of the circuitry. The method can include forming a conductive line such that the backside inductor is electrically connected to the transistor. The conductive line can be formed in a region which is between a frontmost side of the transistor and the semiconductor substrate. The method can include forming any of the features described herein with respect to the semiconductor dies and devices described herein. The method of forming the die with the backside inductor can increase the efficiency of process steps for forming the die.

Figure 5:
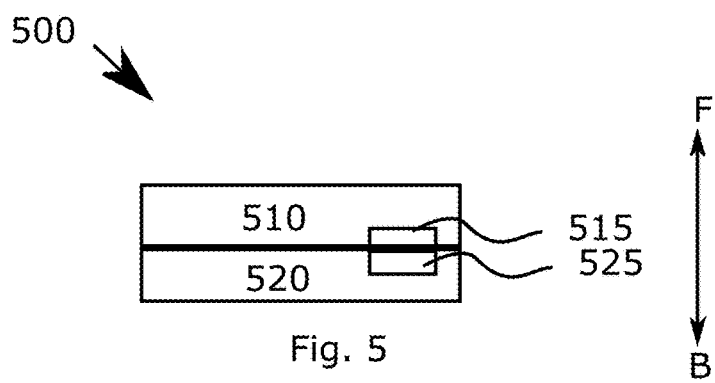
FIG. 5 is a block diagram of an electronic device.

FIG. 5 illustrates an electronic device. The device 500 includes a die 510 which operates in combination with additional circuitry 520. The semiconductor die 510 can be in the form as described elsewhere herein. FIG. 5 shows the front F and back directions B, for convenience.

The backside inductor 515 of the die 510 can inductively couple to an external inductor 525 e.g. an external inductor 525 of the additional circuitry 520. An external inductor 525 can be at a package or board level, e.g. external to the die which includes the backside inductor. Alternatively/additionally, an external inductor 525 can be on a module (e.g. a second die) that is bonded to the die, or on a package attached to the die, or external thereto such as on a circuit board.

The additional circuitry 520 can provide a power supply signal, a data signal and/or a clock signal to the die 510. Alternatively/additionally, the die 510 can be a source of a signal sent to the external circuit 520.

The circuit and/or transistors of the die 510 can be configured to receive at least of a power transmission or signal. For example, the power and/or signal may reach the transistor(s) having been received by the backside inductor, e.g. inductively received from the external inductor 525 of the additional circuitry. The external inductor 525 may be electrically driven or may be inductively coupled to second external inductor. Such chains of inductive coupling may allow for long distance coupling and/or switching.

Figure 6:
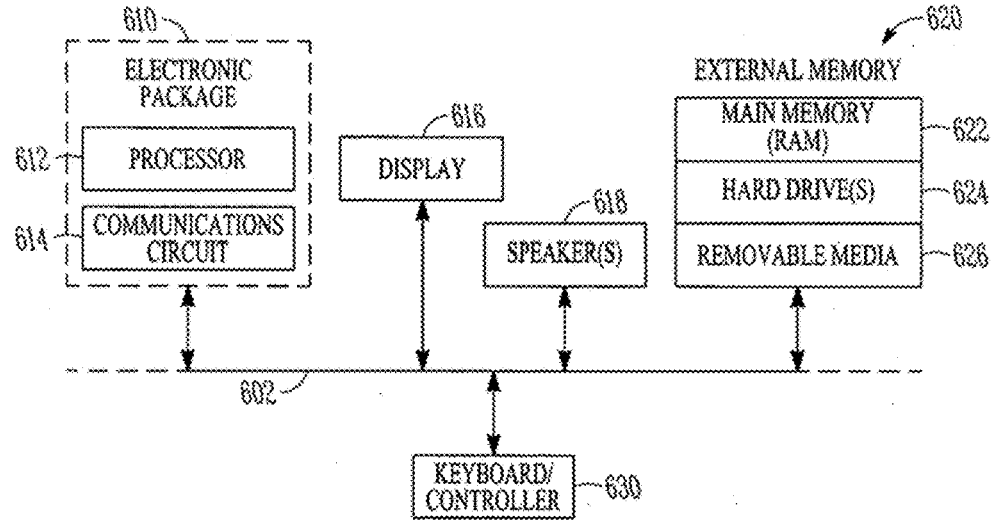
FIG. 6 is a block diagram of an example electronic apparatus.

FIG. 6 is a block diagram of an electronic apparatus 600 incorporating at least one electronic device, die, and/or method described herein. Electronic apparatus 600 is merely one example of an electronic apparatus in which forms of the electronic assemblies, dies, and/or methods described herein may be used. Examples of an electronic apparatus 600 include, but are not limited to, personal computers, tablet computers, mobile telephones, game devices, MP3 or other digital music players, etc. In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic assembly 610 as describe herein may be coupled to system bus 602. The electronic assembly 610 may include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit. The electronic assembly may include any of the dies as described herein.

Other types of circuits that may be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch screen, voice—recognition device, or any other device that permits a system user to input information into and receive information from the electronic apparatus 600.

Figure 7:
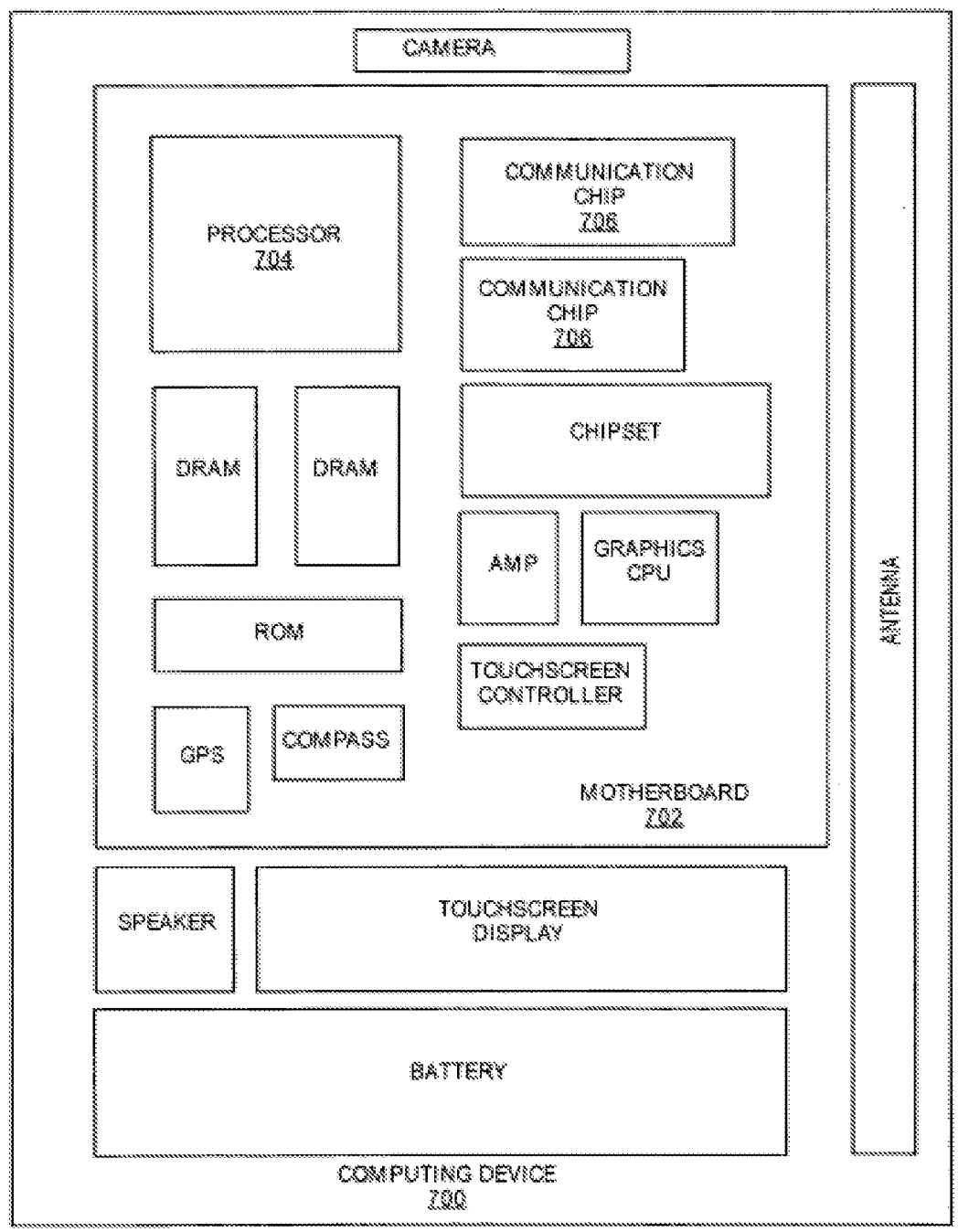
FIG. 7 illustrates a computing device.

FIG. 7 illustrates a computing device 700. The computing device 700 can include a die as described herein. The computing device 700 can house a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704. The communication chip 706 and/or processor 704 can include a die as described herein.

Depending on its applications, computing device 700 may include other components that may or may not be physically and electrically coupled to the board 702. These other components include, but are not limited to, volatile memory (e.g., DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 can enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation. The term oes not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev–DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev—DO, and others.

The processor 704 of the computing device 700 includes an integrated circuit die packaged within the processor 704, e.g. a die as described herein. In some implementations of the invention, the integrated circuit die of the processor includes one or more devices that are assembled in an ePLB or eWLB based POP package that that includes a mold layer directly contacting a substrate, in accordance with implementations of the invention. The term "processor" may refer to any device or portion of device that processes electronic data from registers and/or memory to transform that electronic data into other electronic data that may be stored in registers and/or memory. The communication chip 706 also includes an integrated circuit die packaged (e.g. a die as described herein) within the communication chip 706. In accordance with another implementation of the invention, the integrated circuit die of the communication chip includes one or more devices that are assembled in an ePLB or eWLB based POP package that that includes a mold layer directly contacting a substrate, in accordance with implementations of the invention.

Herein, the vias may be through semiconductor vias and/or through silicon vias. The vias may be microscale, for example, having diameters of about 5-150 such as 15-75 µm. Vias herein may be used for connecting the inductor to the conductive lines (e.g. buried power rail(s)). Alternatively/additionally, vias may be used for connecting a coil at a first metallization layer to a coil of a second metallization to form a multilayer backside inductor.

Herein, pitch can be the sum of width and spacing of the trace of an inductor coil, e.g. at a metallization layer. For example, small pitch corresponds to a close spacing and/or narrow linewidth of the conductive trace of the coil.

Herein, the material of the backside inductor can include copper or aluminum (Cu or Al). The material may be at least 90% or at least 99% copper, or at least 90% Al, or at least 99% Al. The material of the backside inductor includes metal, such as Cu, Al, or tungsten (W). The material may be at least 90% or at least 99% copper. The material may be an alloy of Cu and Al, such as a more than 80% (Cu and Al). Materials of Cu and/or Al may have low ohmic losses. Alternatively/additionally, the material may include ruthenium and/or tungsten. Ru and W may withstand high processing temperatures.

The examples described herein may aid in shrinking semiconductor dies and/or devices particularly by reducing the footprint of structure within the die. The inductive coupling of power, signal, and the like, as shown herein such as by using a backside inductor may replace, at least partially, space-taking structures for power/signal coupling to transistor(s) of dies. Alternatively/additionally, the backside inductors described herein can allow for higher transistor densities, e.g. by improving the efficient use of space of the die, particularly the area/footprint.

Herein, a backside inductor can have at least one winding.

Herein, the backside inductor(s) can include and/or be electrically connected to power supply lines and/or buried power rails in the front end of line (FEOL). The rails/lines may power transistors and/or transmit signals to/from the transistors. The inductor(s) herein can have coils of low resistance, e.g. made of metal, as described herein. The backside inductor(s) described herein can be formed by backside metallization processes, e.g. of the semiconductor die. External coils, e.g. from outside the die/package can couple to the inductor(s) of the die.

The examples herein may provide power and/or signal exclusively by the inductors. The dies/devices described herein may lack power delivery vias from the frontside of the die. Alternatively/additionally, it may be possible to reduce the density of through semiconductor vias at the frontside, including possibly eliminating them. Reduction of the footprint of the die is possible. It is also possible to reduce the risk of electrostatic discharge (ESD) and/or reduce the need for protection against discharge, e.g. by reducing the number of electrical contacts at the surface of the die (e.g. by using inductor(s) at the backside).

Alternatively/additionally, it may be possible to increase the overall density of coupling structures by utilizing the backside (e.g. using backside inductors as described herin) as well as the frontside of the die. More powerful/versatile semiconductor dies can be fabricated.

The dies herein and associated inductively coupled mechanisms can be used for signal/power transformation, signal/clock distribution, and/or chip to chip distribution (e.g. of power and/or signals).

Herein has been described examples in which signal/power is inducted in power lines and/or rails by single or multiple layer backside metallization. Backside metallization can be used to distribute signals and/or power, including to multiple regions of the die/device. External signals and/or power sources can also be coupled in. This can increase efficiency and/or reduce device footprint.

The inductor(s) described herein may simplify and/or at least partially replace interconnect layers and/or interconnect structures which might be otherwise used for electrically coupling the transistors to other components such as components external to the semiconductor die.

Herein, coupling to an external inductor may be an external inductor on a circuit board such as a printed circuit board. Dies described herein may be alternatively/additionally coupled (such as by bonding or the like) to other dies, such as to form a semiconductor package and/or device.

For convenience and/or conciseness, the following enumerated examples are herewith disclosed.

Example 1A is a semiconductor die, comprising a semiconductor substrate, circuitry comprising at least one transistor (referred to in the enumerated examples below as 'a' or 'the' transistor), wherein the transistor is at a frontside of the semiconductor substrate, and a backside inductor at a backside of the semiconductor substrate. The backside inductor is electrically connected to the transistor of the circuitry.

Example 1B is a semiconductor die, comprising: circuitry comprising a transistor at a frontside of a semiconductor substrate, a backside inductor at a backside of the semiconductor substrate. The backside inductor is electrically connected to the transistor of the circuitry.

Example 2 is in accordance with example 1A or 1B, and the backside inductor is electrically connected to a conductive line at the frontside of a semiconductor substrate.

Example 3 is in accordance with any one of examples 1A, 1B, or 2, and the conductive line is arranged vertically between a gate of a transistor and the semiconductor substrate. Alternatively/additionally, the conductive line can be arranged in a region which is between a frontmost part of the transistor and the semiconductor substrate.

Example 4 is in accordance with any one of examples 2 or 3, and the conductive line extends into the semiconductor substrate. Alternatively/additionally, the conductive line is at least partially below a plane at the frontmost side of the semiconductor substrate. There can be an oxide, nitride, and/or other material between the conductive line and the substrate.

Example 5 is in accordance with any one of examples 2-4, and the conductive line is a power supply line or is electrically connected to a power supply line. The power supply line can connect to the transistor(s) for power.

Example 6 is the semiconductor die of any preceding example, and a material of the backside inductor is 90% or more of at least one of copper or aluminum.

Example 7 is the semiconductor die of any preceding example, further comprising: a through semiconductor via conductively connecting the backside inductor to the conductive line.

Example 8 is the semiconductor die of any preceding example, and the transistor is a FinFET, a nanowire transistor, a ribbon transistor, or a gate all around transistor.

Example 9 is the semiconductor die of any preceding example, and the backside inductor is configured to be part of an oscillator circuit.

Example 10 is the semiconductor die of any preceding example, and the backside inductor is configured to be part of a filter circuit.

Example 11 is the semiconductor die of any preceding example, and the conductive line includes a conductive material of at least one of copper, aluminum, ruthenium, or tungsten.

Example 12 is the semiconductor die of any preceding example, and the circuitry includes buried power rails which include at least one of tungsten or ruthenium.

Example 13 is the semiconductor die of any preceding example, and the backside inductor includes a plurality of windings each in a respective plane at the backside, and optionally each winding includes at least one turn.

Example 14 is the semiconductor die of example 13, and the inductor is configured to transfer power to at least one of the circuitry or the conductive line, or the inductor is configured to transfer a signal to at least one of the circuitry or the conductive line.

Example 15 is the semiconductor die of any one of examples 2-12, further comprising: a through semiconductor via which electrically connects the inductor to the conductive line.

Example 16 is the semiconductor die of any one of examples 2-15, and the conductive line is electrically connected to a plurality of sources or a plurality of drains at the transistors for providing power to the transistors.

Example 17 is a method of forming a semiconductor die, including: forming a transistor at a frontside of a semiconductor substrate, forming circuitry including the transistor, and forming a backside inductor at a backside of the semiconductor substrate. The backside inductor is electrically connected to the transistor of the circuitry.

Example 18 is the method of example 17, further including forming a conductive line such that the backside inductor is electrically connected to the transistor.

Example 19 is the method of example 17 or 18, a conductive line is formed so that the backside inductor can be electrically connected to the transistor. Alternatively/ additionally, the conductive line is formed in a region which is between a frontmost side of the transistor and the semiconductor substrate.

Example 20 is the method of example 17, 18, or 19, and the method also includes forming a through semiconductor via for conductively connecting the backside inductor to the conductive line.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A semiconductor die, comprising:
    circuitry comprising a transistor at a frontside of a semiconductor substrate;
    a backside inductor at a backside of the semiconductor substrate; and
    a conductive line at the frontside of the semiconductor substrate,
    wherein the backside inductor is electrically connected to the conductive line and the conductive line is electrically connected to the transistor,
    wherein the conductive line is a power line for providing power to the transistor and buried in the semiconductor substrate under the circuitry.

2. The semiconductor die of claim 1, wherein a material of the backside inductor is 90% or more of at least one of copper or aluminum.

3. The semiconductor die of claim 1, further comprising:
    a through semiconductor via conductively connecting the backside inductor to the conductive line.

4. The semiconductor die of claim 1, wherein the transistor is a fin field-effect transistor, a nanowire transistor, a ribbon transistor, or a gate all around transistor.

5. The semiconductor die of claim 1, wherein the backside inductor is configured to be part of an oscillator circuit.

6. The semiconductor die of claim 1, wherein the backside inductor is configured to be part of a filter circuit.

7. The semiconductor die of claim 1, wherein the conductive line includes a conductive material of at least one of copper, aluminum, ruthenium, or tungsten.

8. The semiconductor die of claim 1, wherein the backside inductor includes a plurality of windings each in a respective plane at the backside.

9. The semiconductor die of claim 8, wherein each winding includes at least one turn.

10. The semiconductor die of claim 1, wherein the conductive line is electrically connected to a source or drain of the transistor.

11. A method of forming a semiconductor die, comprising:
    forming circuitry including a transistor at a frontside of a semiconductor substrate;
    forming a backside inductor at a backside of the semiconductor substrate; and
    forming a conductive line at the frontside of the semiconductor substrate,
    wherein the backside inductor is electrically connected to the conductive line and the conductive line is electrically connected to the transistor,
    wherein the conductive line is a power line for providing power to the transistor and buried in the semiconductor substrate under the circuitry.

12. The method of claim 11, further comprising:
    forming a through semiconductor via for conductively connecting the backside inductor to the conductive line.

* * * * *